(12) United States Patent
Sforzin et al.

(10) Patent No.: US 11,217,306 B2
(45) Date of Patent: *Jan. 4, 2022

(54) APPARATUSES AND METHODS FOR SENSING MEMORY CELLS

(71) Applicant: Micron Technology, Inc., Boise, ID (US)

(72) Inventors: Marco Sforzin, Cernusco Sul Naviglio (IT); Paolo Amato, Treviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/110,782

(22) Filed: Dec. 3, 2020

(65) Prior Publication Data

US 2021/0090648 A1   Mar. 25, 2021

Related U.S. Application Data

(63) Continuation of application No. 16/509,090, filed on Jul. 11, 2019, now Pat. No. 10,861,542, which is a
(Continued)

(51) Int. Cl.
*G11C 11/00* (2006.01)
*G11C 13/00* (2006.01)

(52) U.S. Cl.
CPC ........ *G11C 13/004* (2013.01); *G11C 13/0038* (2013.01); *G11C 2013/0045* (2013.01); *G11C 2213/30* (2013.01); *G11C 2213/71* (2013.01)

(58) Field of Classification Search
CPC .............. G11C 13/004; G11C 13/0038; G11C 2213/71; G11C 2213/30;
(Continued)

(56) References Cited

U.S. PATENT DOCUMENTS 7,054,197 B2   5/2006   Vimercati
7,321,512 B2   1/2008   Vimercati et al.
(Continued)

FOREIGN PATENT DOCUMENTS

CN   101889314 A   11/2010
TW   201626373 A   7/2016

OTHER PUBLICATIONS

U.S. Appl. No. 15/853,328, filed Dec. 22, 2017, Micron Ref. No. 2017-0496.00/US, 61 pages.
(Continued)

*Primary Examiner* — Tha-O H Bui
(74) *Attorney, Agent, or Firm* — Brooks, Cameron & Huebsch, PLLC (57) ABSTRACT

Sensing memory cells can include: applying a voltage ramp to a group of memory cells to sense their respective states; sensing when a first switching event occurs to one of the memory cells responsive to the applied voltage ramp; stopping application of the voltage ramp after a particular amount of time subsequent to when the first switching event occurs; and determining which additional memory cells of the group experience the switching event during the particular amount of time. Those cells determined to have experienced the switching event responsive to the applied voltage ramp are sensed as storing a first data value and those cells determined to not have experienced the switching event responsive to the applied voltage ramp are sensed as storing a second data value. The group stores data according to an encoding function constrained such that each code pattern includes at least one data unit having the first data value.

20 Claims, 9 Drawing Sheets

Related U.S. Application Data continuation of application No. 15/957,173, filed on Apr. 19, 2018, now Pat. No. 10,424,372.

(58) Field of Classification Search
CPC ............ G11C 2013/0045; G11C 16/26; G11C 13/0061; G11C 2213/76; G11C 2013/0052; G11C 13/0004; G11C 16/30; G11C 7/06; G06F 3/0658
USPC .......................................................... 365/148
See application file for complete search history.

(56) References Cited

U.S. PATENT DOCUMENTS

| | | | |
|---|---|---|---|
| 7,345,905 B2 | 3/2008 | Pio et al. | |
| 7,554,861 B2 | 6/2009 | Vimercati et al. | |
| 7,817,475 B2 | 10/2010 | Lowrey | |
| 8,116,117 B2 | 2/2012 | Cho | |
| 8,279,664 B2 | 10/2012 | Chang | |
| 10,424,372 B1 | 9/2019 | Sforzin | |
| 10,861,542 B2* | 12/2020 | Sforzin | G11C 13/0038 |
| 2010/0085799 A1* | 4/2010 | Cho | G11C 13/004 365/148 |
| 2011/0242900 A1 | 10/2011 | Hoei | |
| 2012/0008399 A1 | 1/2012 | Hoei et al. | |
| 2014/0098607 A1 | 4/2014 | Sarin et al. | |
| 2016/0372194 A1 | 12/2016 | Ly-Gagnon | |
| 2016/0372200 A1 | 12/2016 | Li et al. | |
| 2017/0206956 A1* | 7/2017 | Foltin | G11C 13/0097 |

OTHER PUBLICATIONS

U.S. Appl. No. 15/853,364, filed Dec. 22, 2017, Micron Ref. No. 2017-1039.00/US, 63 pages.

International Search Report and Written Opinion for related international application No. PCT/US2019/023502, dated Jul. 5, 2019, 12 pages.

Related International Chinese Patent Application Serial No. 201980026764.9, dated Mar. 24, 2021, 18 pages.

\* cited by examiner

CODE BITS

| A | B | C | D | |
|---|---|---|---|---|
| 0 | 0 | 0 | 0 | ← 741-1 |
| 0 | 0 | 0 | 1 | ← 741-2 |
| 0 | 0 | 1 | 0 | ← 741-3 |
| 0 | 0 | 1 | 1 | |
| 0 | 1 | 0 | 0 | ← 741-5 |
| 0 | 1 | 0 | 1 | |
| 0 | 1 | 1 | 0 | |
| 0 | 1 | 1 | 1 | |
| 1 | 0 | 0 | 0 | ← 741-9 |
| 1 | 0 | 0 | 1 | |
| 1 | 0 | 1 | 0 | |
| 1 | 0 | 1 | 1 | |
| 1 | 1 | 0 | 0 | |
| 1 | 1 | 0 | 1 | |
| 1 | 1 | 1 | 0 | |
| 1 | 1 | 1 | 1 | ← 741-16 |

APPARATUSES AND METHODS FOR SENSING MEMORY CELLS

PRIORITY INFORMATION

This application is a Continuation of U.S. application Ser. No. 16/509,090, filed Jul. 11, 2019, which will issue as U.S. Pat. No. 10,861,542 on Dec. 8, 2020, which is a Continuation of U.S. application Ser. No. 15/957,173, filed Apr. 19, 2018, now granted as U.S. Pat. No. 10,424,372 on Sep. 24, 2019, the contents of which are incorporated herein by reference.

TECHNICAL FIELD

The present disclosure relates generally to apparatus, such as storage systems, and their operation, and, more particularly, to apparatuses and methods for sensing memory cells.

BACKGROUND

Storage systems may be implemented in electronic systems, such as computers, cell phones, hand-held electronic devices, etc. Some storage systems, such as solid state drives (SSDs), embedded Multi-Media Controller (eMMC) devices, Universal Flash Storage (UFS) devices, and the like may include non-volatile storage memories for storing user data from a host. Non-volatile storage memories provide persistent data by retaining stored data when not powered and may include NAND flash memory, phase change memory (PCM), resistive random access memory (RRAM), magnetic random access memory (MRAM), and programmable conductive memory, among other types of memory that can be written to a particular number of times throughout their lifetime.

Non-volatile memory cells can be programmed to a desired state. As an example, some memory cells can be programmed to one of multiple states that can correspond to (e.g., be encoded with) different bit patterns. The particular programmed state of a cell can be determined by, for example, comparing the threshold voltage of the cell to a reference voltage In some examples, a threshold voltage (Vt) of a cell can drift, which can make accurate sensing (e.g., reading) difficult since the drift may need to be tracked in order to ensure use of proper demarcation/read voltages.

DETAILED DESCRIPTION

Sensing memory cells can include: applying a voltage ramp to a group of memory cells to sense their respective states; sensing when a first switching event occurs to one of the memory cells responsive to the applied voltage ramp; stopping application of the voltage ramp after a particular amount of time subsequent to when the first switching event occurs; and determining which additional memory cells of the group experience the switching event during the particular amount of time. Those cells determined to have experienced the switching event responsive to the applied voltage ramp are sensed as storing a first data value and those cells determined to not have experienced the switching event responsive to the applied voltage ramp are sensed as storing a second data value. The group stores data according to an encoding function constrained such that each code pattern includes at least one data unit having the first data value.

Embodiments of the present disclosure provide a technical advantage over prior approaches by overcoming the problems associated with threshold voltage drift that may occur as some memory cells, such as resistance variable memory cells, age and/or change temperature. For example, during a sensing operation, such as a read operation, the sensing voltage may be applied across a memory cell to determine the state of the memory cell, corresponding to the threshold voltage of the memory cell. However, as the number of times the memory cell is overwritten with new data increases (e.g., as the memory cell ages) and/or the temperature of the memory cell changes, the threshold voltage corresponding to the state of the cell may change, making it difficult to accurately determine the state of the memory cell using the sensing voltage.

However, embodiments of the present disclosure avoid the need to use a sensing voltage, and thus overcome the problems associated with drift. For example, one memory cell of a group of memory cells may be programmed to a particular state such that the memory cell experiences a switching event (e.g., in response to a ramp voltage) before additional memory cells in the group. The states of the additional memory cells in the group may then be determined based on whether they experience a switching event in response to the ramp voltage within a particular time of when the one memory cell programmed to the particular state experiences a switching event. This allows the states of the remaining memory cells to be determined relative the particular state of the one memory cell, thus allowing the sensing to effectively follow the drift of the particular state, thereby overcoming the problems associated with the drift.

Figure 1:
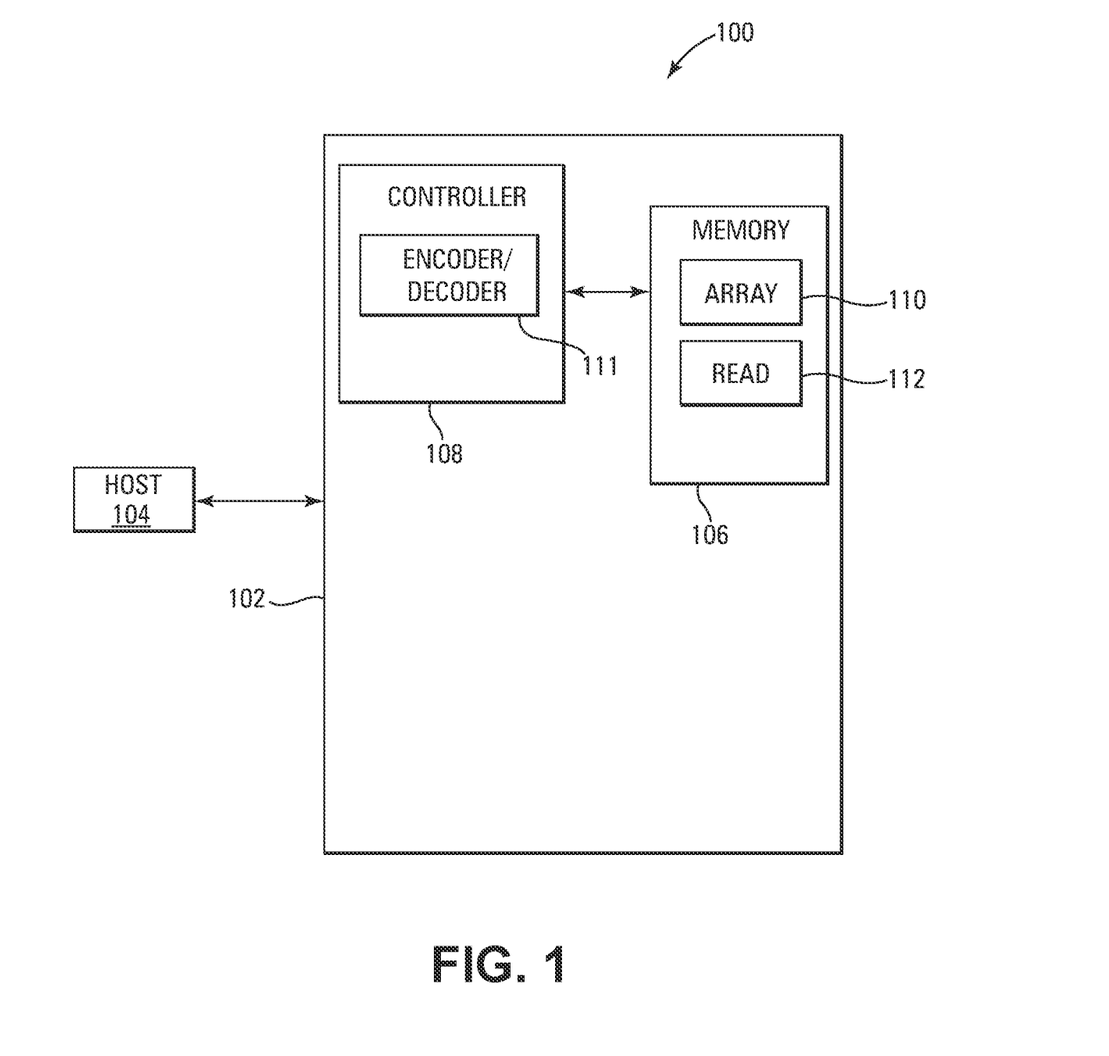
FIG. 1 is a block diagram of an apparatus, in accordance with a number of embodiments of the present disclosure.

FIG. 1 is a block diagram of an apparatus in the form of a computing system 100, in accordance with a number of embodiments of the present disclosure. Computing system 100 includes a memory system 102 that can be, for example, a storage system such as an SSD, a UFS device, an embedded eMMC device, etc. However, embodiments are not limited to a particular type of memory system. For example, memory system 102 could serve as main memory for system 100.

As shown in FIG. 1, the system 102 can include a controller 108 coupled to a memory 106 and host 104. Host 104 can be, for example, a host system such as a personal laptop computer, a desktop computer, a digital camera, a mobile device (e.g., cellular phone), network server, Internet of Things (IoT) enabled device, or a memory card reader, among various other types of hosts. For instance, host 104 can include one or more processors capable of accessing memory 106 (e.g., via controller 108) over an interface, which can include a bus. The interface may be a standardized interface, such as a serial advanced technology attachment (SATA), peripheral component interconnect express (PCIe), or a universal serial bus (USB), among various others.

Memory 106 can comprise a number of memory devices (e.g., memory dies, chips, etc.), which each can comprise a number of arrays 110. The arrays 110 can include two-dimensional (2D) and/or three-dimensional (3D) array structures, such as cross point array structures. The memory cells can include, for example, various types of resistance variable (e.g., PCRAM cells, RRAM cells, 3D cross point cells), which may comprise a resistance variable storage element and/or switch element. In a number of embodiments, the memory cells can be self-selecting memory (SSM) cells in which a single material can serve as both the storage element and the memory element.

As an example, the memory cells can be phase change memory (PCM) cells, which can be chalcogenide based memory cells comprising a single chalcogenide material serving as both a storage element and a switch element for the cells and/or a stack of materials with a first chalcogenide material serving as a switch element and a second chalcogenide serving as a storage element for the cells. However, embodiments are not limited to a particular array architecture and/or memory cell type. For instance, the array 110 might comprise NAND flash memory cells and/or NOR flash memory cells, among others.

The memory device 106 includes a read component 112 that can comprise various circuitry associated with operating memory cells in accordance with embodiments of the present disclosure. For example, as described further below, the read component can include sense amplifiers.

The controller 108 can comprise, for example, a state machine, a sequencer, and or some other type of control circuitry, and can communicate with the memory devices 106 to control data read, write, and erase operations, among other operations. The controller 108 can include, for example, a number of components in the form of hardware (e.g., one or more integrated circuits) and/or software (e.g., instructions, which may be in the form of firmware) for controlling access to the number of memory devices 106 and/or for facilitating data transfer between the host 104 and memory devices 106. In general, the controller 108 can receive and execute commands from the host 104 to achieve the desired access to the memory 106. The controller 108 can be responsible for, among other things, performing various methods for improved memory operations in accordance with embodiments described herein.

Controller 108 can include an encoder/decoder 111 that can be used to map between stored data patterns and code patterns, as described further herein. In some examples, a group of memory cells can store data according to an encoding function implemented by encoder/decoder 111. For example, the encoding function can be constrained such that each code pattern corresponding to a data pattern stored by a group of cells includes at least one data unit having particular data value.

Controller 108 is configured to perform the methods disclosed herein, such as reading, in accordance with a number of embodiments. For example, a memory cell of a group of memory cells may programmed to have a particular state, such as the lowest state to which the memory cells can be programmed. For a group of two memory cells, for example, controller 108 may determine a state of the remaining memory cell based on whether the remaining memory cell experiences a switching event within a particular time after the memory cell at the particular state experiences a switching event. For example, if the remaining memory cell experiences a switching event within the particular time after the memory cell programmed to the particular state experiences a switching event, controller 108 may determine that the two memory cells have the same state. Otherwise, controller 108 may determine that the two memory cells have different states. For example, the switching event can involve switching from a non-conductive state of the memory cell to a conductive state of the memory cell.

Figure 2:
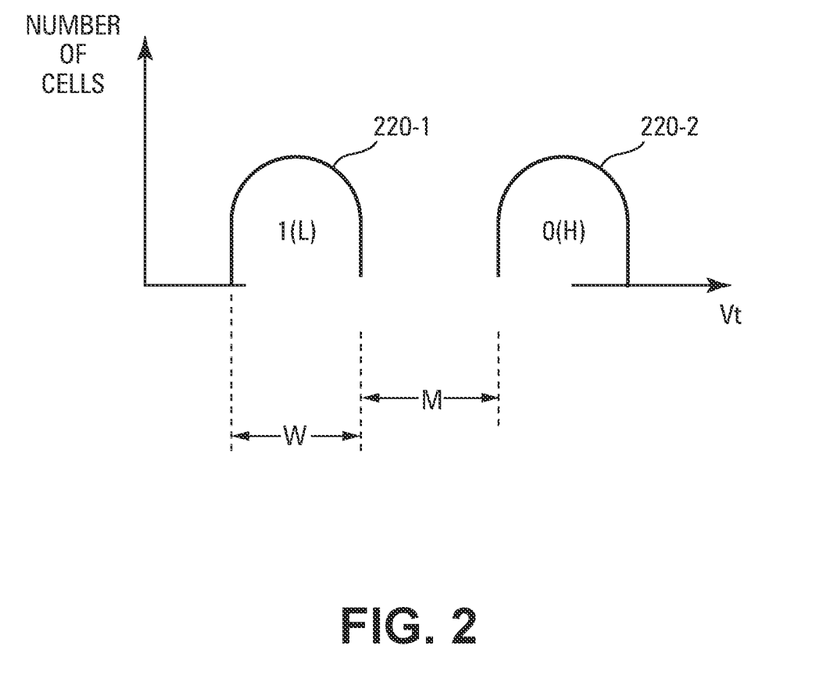
FIG. 2 illustrates an example of threshold voltage distributions corresponding to states to which memory cells can be programmed, in accordance with a number of embodiments of the present disclosure.

FIG. 2 illustrates an example of Vt distributions corresponding to states to which memory cells can be programmed, in accordance with a number of embodiments of the present disclosure. Vt distributions 220-1 and 220-2 respectively correspond to a low state (e.g., Vt level) L and a higher state H. A memory cell having a state L can be encoded with code bit of 1 (e.g., a logical level 1), and a memory cell having a state H can be encoded with a code bit of 0 (e.g., logical level 0). For example, the H state may be referred to as state 0, and the L state may be referred to as state 1.

The states 0 and 1 may respectively correspond to different resistance levels to which the respective corresponding memory cells are programmed. In some examples, the width W of Vt distribution 220-1 in volts (e.g., the range of Vts corresponding Vt distribution 220-1) is less than the margin M in volts (e.g., the range of Vts) between Vt distribution 220-1 and Vt distribution 220-2.

Figure 3:
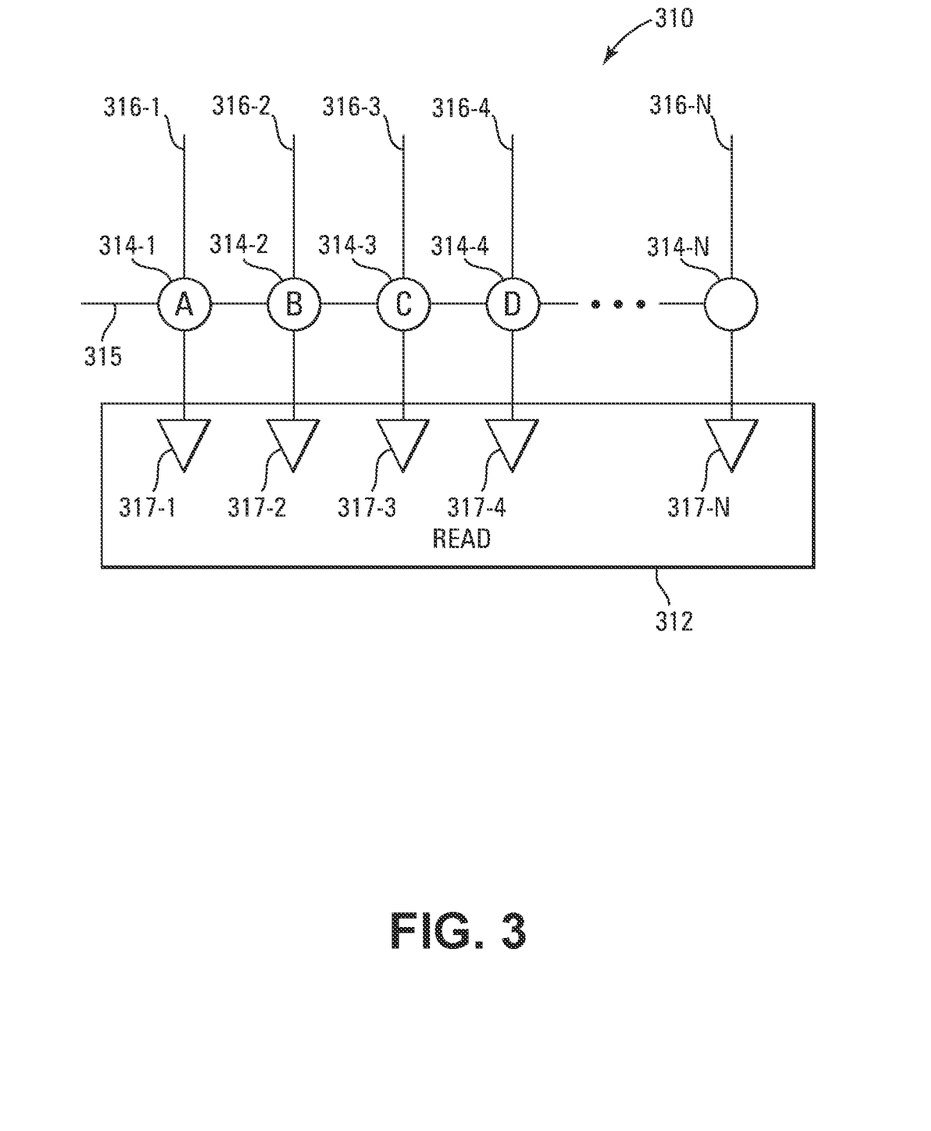
FIG. 3 illustrates an example of a portion of a memory that can be sensed using the methods disclosed herein, in accordance with a number of embodiments of the present disclosure.

FIG. 3 shows an example of a portion of memory array 310 that may be read using the methods disclosed herein, in accordance with a number of embodiments of the present disclosure. Memory array 310 can be a portion of memory array 110, in some examples. Memory array 310 includes memory cells 314-1 to 314-N, such as cross-point memory cells, located at intersections of a signal line 315, such as a word line, and signal lines 316-1 to 316-N, such as bit lines. For instance, memory cells 314-1 to 314-N are respectively coupled to signal lines 316-1 to 316-N and are commonly coupled to signal line 315. Signal lines 316-1 to 316-N, and thus memory cells 314-1 to 314-N, can be coupled to a read component 312 that can be included in read component 112, for example. Read component 312 can include sense amplifiers 317-1 to 317-N that are respectively coupled to signal lines 316-1 to 316-N, and thus to memory cells 314-1 to 314-N.

Sense amplifiers 317-1 to 317-N may respectively output voltages respectively indicative of memory cells 314-1 to 314-N undergoing switching events, such as thresholding events (e.g., snapback events), in response to voltages being applied across memory cells 314-1 to 314-N being greater than or equal to threshold voltages (Vts) of memory cells 314-1 to 314-N. For example, the memory cells may switch from one conductivity state, such as a low conductivity state (e.g., high resistive state), to another conductivity state, such as a high conductivity state (e.g. a low resistive state). A sense amplifier may sense the switching event by sensing a change in current through the memory cell that may be reflected in the output voltage of the sense amplifier.

In some examples, a timewise increasing ramp voltage can be applied to signal line 315 while concurrently applying a voltage (e.g., the same voltage) to signal lines 316-1 to 316-N so that a timewise increasing ramp voltage is applied across (e.g., to) memory cells 314-1 to 314-N concurrently. Sense amplifiers 317-1 to 317-N can sense respective switching events of memory cells 314-1 to 314-N in response to applying the ramp voltage across memory cells 314-1 to 314-N.

Memory cells 314 can be, for example, resistance variable memory cells whose respective states (e.g., stored data values) depend on the respective programmed resistances of memory cells. Memory cells 314 can be overwritten individually without first being erased, in some examples.

In some examples, a first group of two memory cells, such as memory cells 314-1 (A) and 314-2 (B), may be programmed to a collective state by respectively programming memory cells 314-1 (A) and 314-2 (B) to one of the states 1 and 0. Similarly, a second group of two memory cells, such as memory cells 314-3 (C) and 314-4 (D), may be programmed to a collective state by respectively programming memory cells 314-3 (C) and 314-4 (D) to one of the states 1 and 0. In other examples, other groups having other numbers of cells, such as three cells, four cells, up to N cells, are envisioned. Hereinafter, memory cells 314-1 (A), 314-2 (B), 314-3 (C), and 314-4 (D) will be respectively referred to as memory cells A, B, C, and D.

Figure 4A:
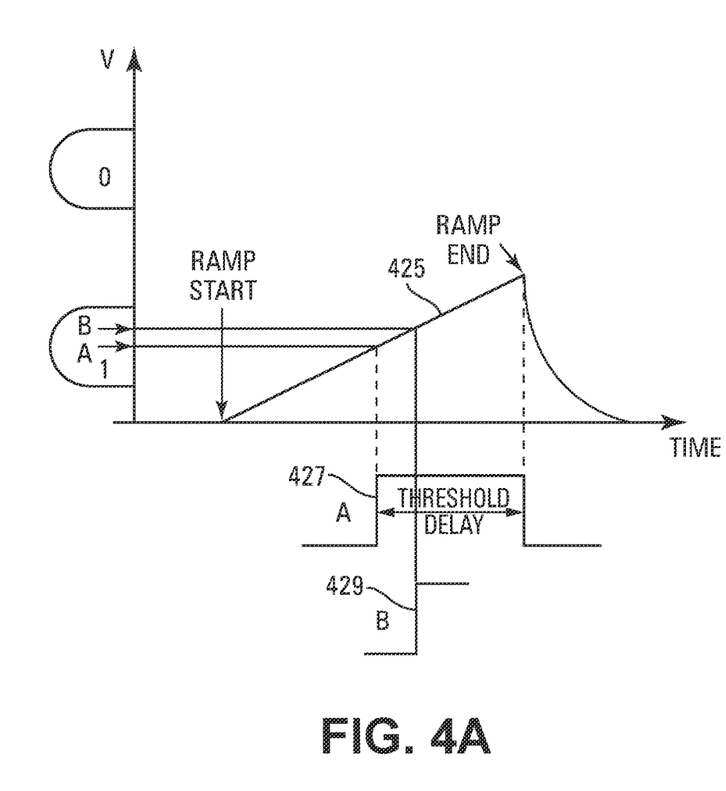
FIG. 4A is a graphical illustration in which two memory cells are determined to have the same state, in accordance with a number of embodiments of the present disclosure.
Figure 4B:
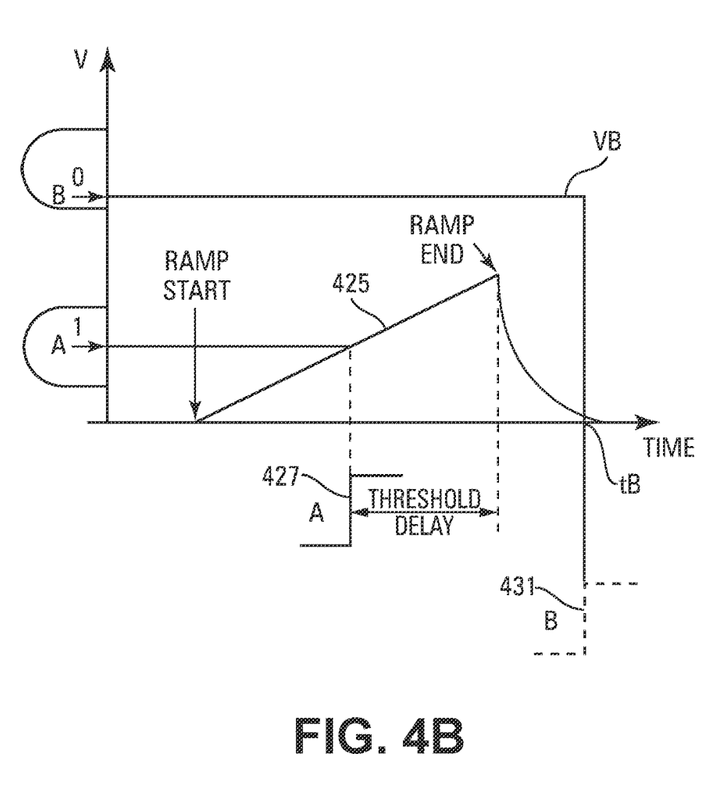
FIG. 4B is a graphical illustration in which two memory cells are determined to have different states, in accordance with a number of embodiments of the present disclosure.

FIG. 4A is a graphical illustration in which two memory cells of a group of memory cells are determined to have the same state, in accordance with a number of embodiments of the present disclosure. FIG. 4B is a graphical illustration in which two memory cells of a group of memory cells are determined to have different states, in accordance with a number of embodiments of the present disclosure. For example, FIGS. 4A and 4B correspond to (e.g., illustrate what occurs during) a read operation performed by controller 108. FIGS. 4A and 4B illustrate determining a state of a memory cell, such as memory cell B, based on whether that memory cell experiences a switching event (e.g., switches) within a particular time (e.g., that may be referred to as a threshold delay time) of when (e.g. after) another memory cell, such as memory cell A, experiences a switching event.

As shown in the examples of FIGS. 4A and 4B, a timewise increasing ramp voltage 425 is applied across memory cells A and B concurrently. For example, a timewise increasing ramp voltage may be applied to access line 315 in FIG. 3 while the same fixed voltage is applied to access lines 316-1 and 316-2 in FIG. 3 concurrently, resulting in ramp voltage 425.

The Vt distributions corresponding to states 1 and 0 are superimposed on the voltage V axis in FIGS. 4A and 4B. A starting voltage of ramp voltage 425 is less than the Vts of the Vt distributions corresponding to state 1, corresponding to the lowest state to which the memory cells can be programmed.

Note that the examples of FIGS. 4A and 4B involve determining a collective state of a group of two memory cells (e.g., memory cells A and B) by determining the individual state of each of the two memory cells, but may be applied to groups having any number of memory cells. In some examples, at least one memory cell of a group, such as memory cell A in this example, is to be programmed to a particular state, such as the state 1, and the states of the other memory cells in the group, such as the state memory cell B in this example, are to be determined relative to the particular state. In some examples, the memory cell programmed to the state 1 may be referred to as set memory cell and may be the first memory cell in the group to experience a switching event in response to ramp voltage 425. For example, the set memory cell acts as a reference memory cell and requires that each collective state a group of memory cells can have a memory cell with the state 1. For example, the respective states of the memory cells can be determined without utilizing a separate reference voltage to which the respective threshold voltages are compared. The group including memory cells A and B stores data according to an encoding function constrained such that a corresponding code pattern includes at least one data unit having a data value 1, corresponding to state 1.

In FIGS. 4A and 4B, memory cell A is the first memory cell to switch as indicated by step 427 and may be the set memory cell. For example, memory cell A may be in state 1. Memory cell A switches when the voltage of voltage ramp 425 reaches the Vt of memory cell A. Ramp voltage 425 is applied to memory cells A and B for the threshold delay time after memory cell A switches. Memory cell B switches when the voltage of voltage ramp 425 reaches the Vt of memory cell B as indicated by step 429.

When memory cell B switches within the threshold delay time after memory cell A switches, as shown in FIG. 4A, it is determined that memory cell B is also in state 1. For example, memory cell A and B are sensed as storing a data value of 1. Therefore, the collective state of memory cells A and B is determined to be 11 in FIG. 4A.

In some examples, ramp voltage 425 is removed from the memory cells A and B at the threshold delay time after memory cell A switches. In an example, the threshold delay time may be equal to the width W of the Vt distribution, such as Vt distribution 220-1, corresponding to the lowest state divided by the slope S (e.g., the rate of change) of ramp voltage 425. For example, threshold delay time may be W/S.

When memory cell B fails to switch within the threshold delay time after memory cell A switches, as shown in FIG. 4B, it is determined that memory cell B is in state 0. For example, memory cell B may be determined to be in state 0 without waiting for memory cell B to switch. For example, when memory cell B fails to switch before ramp voltage 425 is removed, it is determined to be in state 0. The collective state of memory cells A and B in FIG. 4B is determined to be 10, the respective individual states of memory cells A and B determined in FIG. 4B. Note that the group of memory cells A and B stores data according to an encoding function constrained such that respective code patterns 11 and 10 include at least one data unit having the data value 1, for example.

Note that memory cell B in FIG. 4B does not switch until a time tB when the voltage across memory cell B is the voltage VB and indicated by step 431 in FIG. 4B. However, the state of memory cell B can be determined at the threshold delay time after memory cell A switches without waiting until time tB.

The examples of FIGS. 4A and 4B are not limited to memory cell A being the set memory cell. For example, memory cells A and B may be interchanged in FIGS. 4A and 4B, in which case memory cell B is the set memory cell.

Therefore, the collective state in FIG. 4A will remain the same (e.g., 11) since both memory cell A and memory cell B will be in state 1. However, the collective state in FIG. 4A will be inverted (e.g., 01) since memory cell A will be in state 0 and memory cell B will be in state 1.

Figure 5:
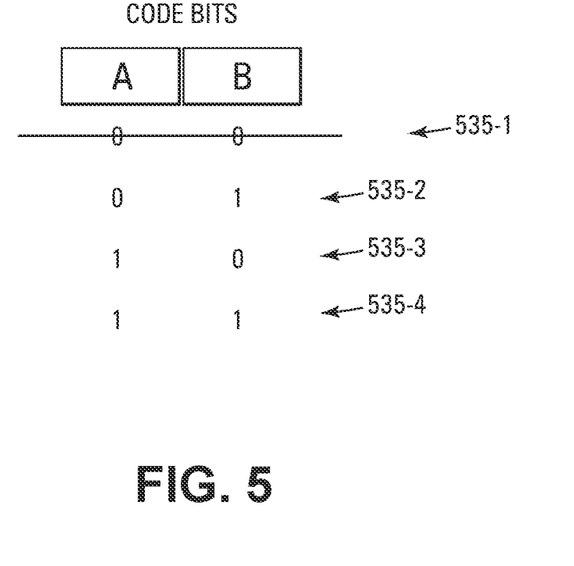
FIG. 5 illustrates the collective states that the group of memory cells can have and the corresponding bit codes, in accordance with a number of embodiments of the present disclosure.

FIG. 5 illustrates the collective states that the group of two-state memory cells A and B can have and the corresponding bit codes, in accordance with a number of embodiments of the present disclosure. For example, the bit codes include the individual bits corresponding the individual states of memory cells A and B. In method described in conjunction with FIGS. 4A and 4B, at least one of memory cells A and B may be programmed to state 1, thus precluding the collective state 535-1 in which both memory cells A and B are in state 0. This means that in the remaining collective states 535-2 to 535-4 at least one of the memory cells A and B is in state 1, as shown in FIG. 5. FIG. 5 illustrates an example storing data according to an encoding function constrained such that respective code patterns include at least the data value 1, for example.

In the examples of FIGS. 4A and 4B, applying the ramp voltage to memory cells A and B, having a set memory cell that is in the state 1, such as memory cell A, and determining the state of memory cell B based on whether memory cell B switches within the threshold delay time of when memory cell A switches, overcomes the problems associated with drift. This is because the ramp voltage allows the state of memory cell A to be determined regardless of whether state 1 drifted and because the state of memory cell B is determined relative to state 1 regardless of whether state 1 drifted.

In some examples, the method described in conjunction with FIGS. 4A and 4B may be used to determine the collective states of the group of memory cells C and D in FIG. 3. For example, memory cells C and D may be respectively substituted for memory cells A and B in the method described in conjunction with FIGS. 4A and 4B and in the example depicted in FIG. 5. For instance, the group of memory cells C and D may have the collective states 535-2 to 535-4 depicted in the example of FIG. 5.

Figure 6:
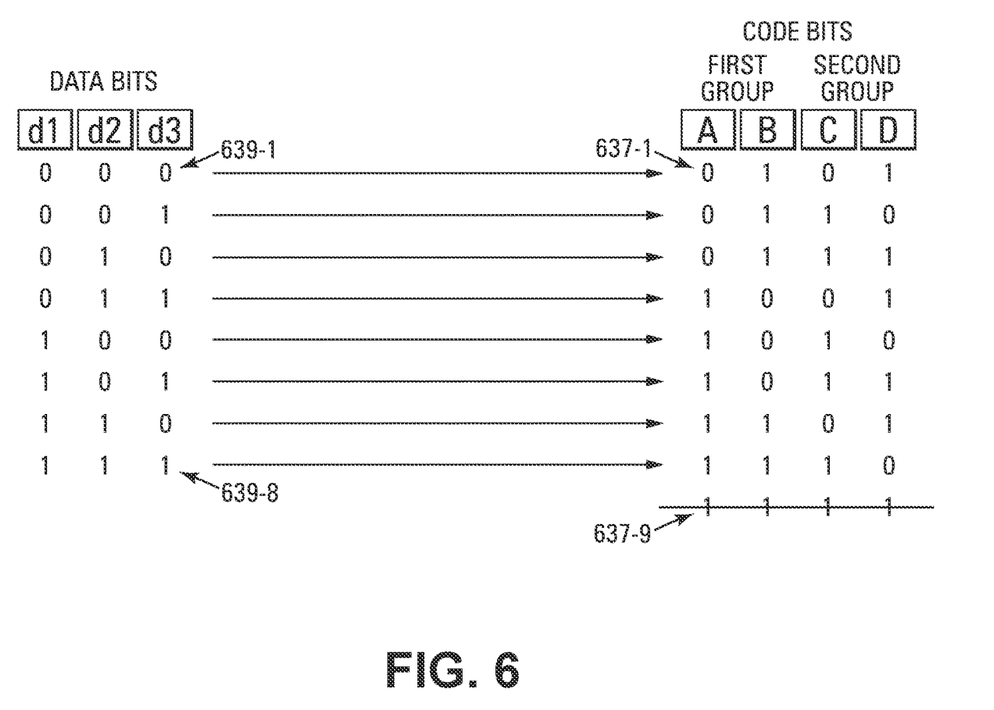
FIG. 6 illustrates assigning groups of data bits to the code bits resulting from combining two groups of memory cells, in accordance with a number of embodiments of the present disclosure.

FIG. 6 illustrates assigning groups of three data bits (e.g., data states) of a data pattern to the code bits of a code pattern resulting from combining two groups of two memory cells, in accordance with a number of embodiments of the present disclosure. In FIG. 6, each of the data bits d1, d2, and d3 correspond to one of the two states 0 and 1. Therefore, there are eight possible data states 639-1 to 639-8, each corresponding to a different data pattern. In FIG. 6, the group (e.g., a first group) of memory cells A and B and the group (e.g., a second group) memory cells C and D and their respective collective states are combined. FIG. 6 shows the nine combined collective states 637-1 to 637-9 of the combined first and second groups, where each collective state corresponds to a different code pattern. In the example of FIG. 6, data states 639-1 to 639-8 are respectively assigned to combined collective states 637-1 to 637-8, thereby leaving combined collective state 637-9 unused. The collective states 637-1 to 637-8 are respectively encoded in accordance with the assigned encodings 639-1 to 639-8, for example.

In the example of FIG. 6, the three-bit data patterns are mapped to four-bit code patterns. In general, an encoding function can map n-bit data patterns (e.g., n=3 in FIG. 6) to respective (n+1)-bit code patterns, where "n" is a number greater than two, and where each of the (n+1)-bit code patterns is a combined code pattern comprising the code patterns per set of memory cells, such as memory cells A, B, C, and, D in FIG. 6.

In some examples, the method described in conjunction with FIGS. 4A and 4B may be used to determine the states of the memory cells in groups of memory cells having more than two memory cells. For example, memory cells A, B, C, and D (e.g., each operating as a two-state cell) may be treated as a group of memory cells, and the individual states of memory cells A, B, C, and D, and thus the collective state of the group, may be determined.

For example, one of memory cells A, B, C, and D may be a set memory cell and may be in state 1. Ramp voltage 425 may be applied across memory cells A, B, C, and D concurrently, and the first memory cell that switches is in state 1 and is the set memory cell. Voltage ramp 425 is then applied until the threshold delay time after the set memory cell switches, at which time ramp voltage 425 is removed. Any of the remaining memory cells in the group that switches while is ramp voltage 425 is being applied is determined to be in state 1, whereas any of the remaining memory cells that do not switch while ramp voltage 425 is being applied is in state 0.

Figure 7:
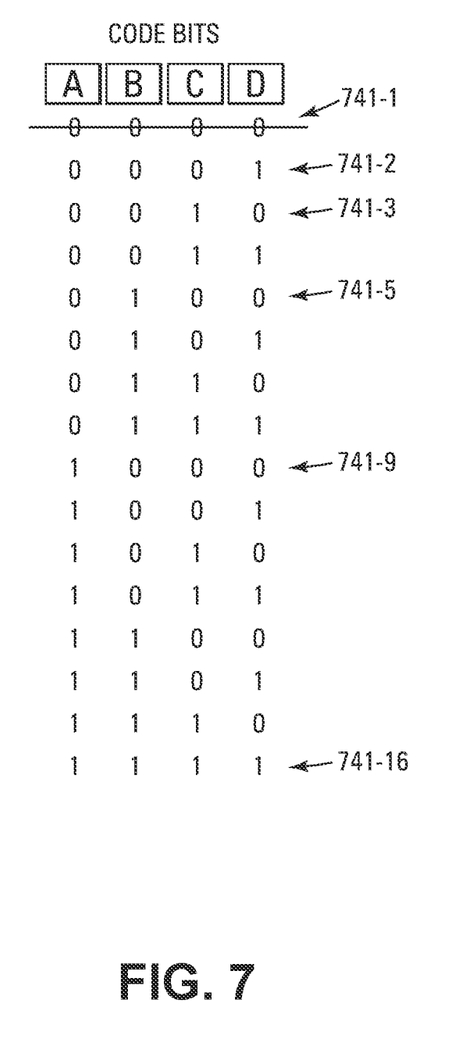
FIG. 7 illustrates the possible collective states that a group of memory cells can have and the corresponding bit codes, in accordance with a number of embodiments of the present disclosure.

FIG. 7 illustrates the possible collective states that the group of two-state memory cells A, B, C, and D can have and the corresponding bit codes, in accordance with a number of embodiments of the disclosure. For example, the bit codes include the individual bits corresponding the individual states of memory cells A, B, C, and D. However, at least one of memory cells A, B, C, and D (e.g., the set memory cell) is programmed to state 1, thus precluding the collective state 741-1 in which all of memory cells A, B, C, and D are in state 0. This means that in the remaining collective states 741-2 to 741-16 at least one of the memory cells A, B, C, and D is in state 1, as shown in FIG. 7. FIG. 7 illustrates another example storing data according to an encoding function constrained such that respective code patterns include at least the data value 1, for example. The encoding function can be applied on per set basis (e.g., the set including memory cells A, B, C, and D) such that the code patterns per set include only those code patterns having at least one of the first data value, such as the data value 1 in FIG. 7.

Note that in the example of FIG. 5, there are $2^2-1=3$ available collective states for two memory cells, and in the example of FIG. 5, there are $2^4-1=15$ available collective states for four memory cells. In general, there are $2^N-1$ available collective states for N memory cells. The loss of one state is due the having one memory cell in a group be a set memory cell in state 1. However, the problems associated with drift are overcome by determining the states of the remaining cells according to when the set cell switches.

In the example of FIG. 7 any one of memory cells A, B, C, and D can be the set cell, as long as it is the first memory cell of the group to switch. For example, memory cells D, C, B, and A are respectively the set memory cells for collective states 741-2, 741-3, 741-5, and 741-9.

In other examples, the same memory cell in a group may be the set cell, meaning that the same cell in the group will always switch first. The states of the remaining memory cells may then be determined according to whether they switch within the threshold delay time of when the set memory cell switches. For such examples, only the remaining memory cells may be used for data storage and the states of the remaining memory cells may correspond to code bits.

Figure 8:
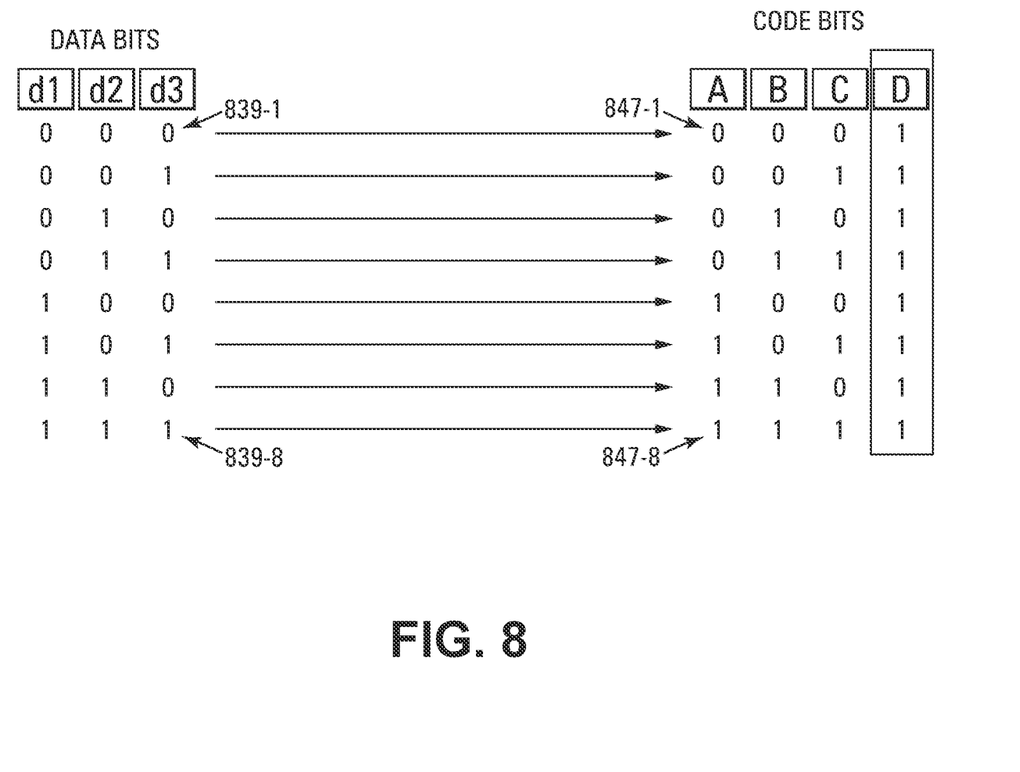
FIG. 8 illustrates assigning groups of data bits to code bits corresponding to collective states of a group of memory cells in which the same memory cell of the group is programmed to a particular state, in accordance with a number of embodiments of the present disclosure.

FIG. 8 illustrates assigning groups of three data bits (e.g., data states) of data patterns to the code bits code patterns corresponding to collective states of a group of memory cells in which the same memory cell of the group is assigned to the same state, in accordance with a number of embodiments. In FIG. 8, memory cell D of the group of memory cells A, B, C, and D may always be programmed to state 1, and the remaining memory cells A, B, C can be programed to either state 1 or state 0. This means that the number of possible collective states is based on three memory cells and is thus $2^3=8$.

In FIG. 8, the three data bits d1, d2, d3 of a three-bit data pattern are respectively stored in memory cells A, B, and C. For example, the states of data bits d1, d2, d3 may be as previously described in conjunction with FIG. 6 correspond one-to-one with the data states of memory cells A, B, and C. The data states 839-1 to 839-8 are respectively assigned to collective states 847-1 to 847-8, each corresponding to a four-bit code pattern. For example, the collective states 847-1 to 847-8 are respectively encoded in accordance with the assigned encodings 839-1 to 839-8.

In the example of FIG. 8, n-bit (e.g., three-bit) data patterns are mapped to (n+1)-bit code patterns. In general, an encoding function can map n-bit data patterns to respective (n+1)-bit code patterns. The encoding function can map each one of the n-bit data patterns to a matching one of the (n+1)-bit code patterns with an additional bit having a particular data value, such as a data value of 1, added, where the additional bit is a last bit of the (n+1)-bit code patterns, as shown in FIG. 8.

Figure 9:
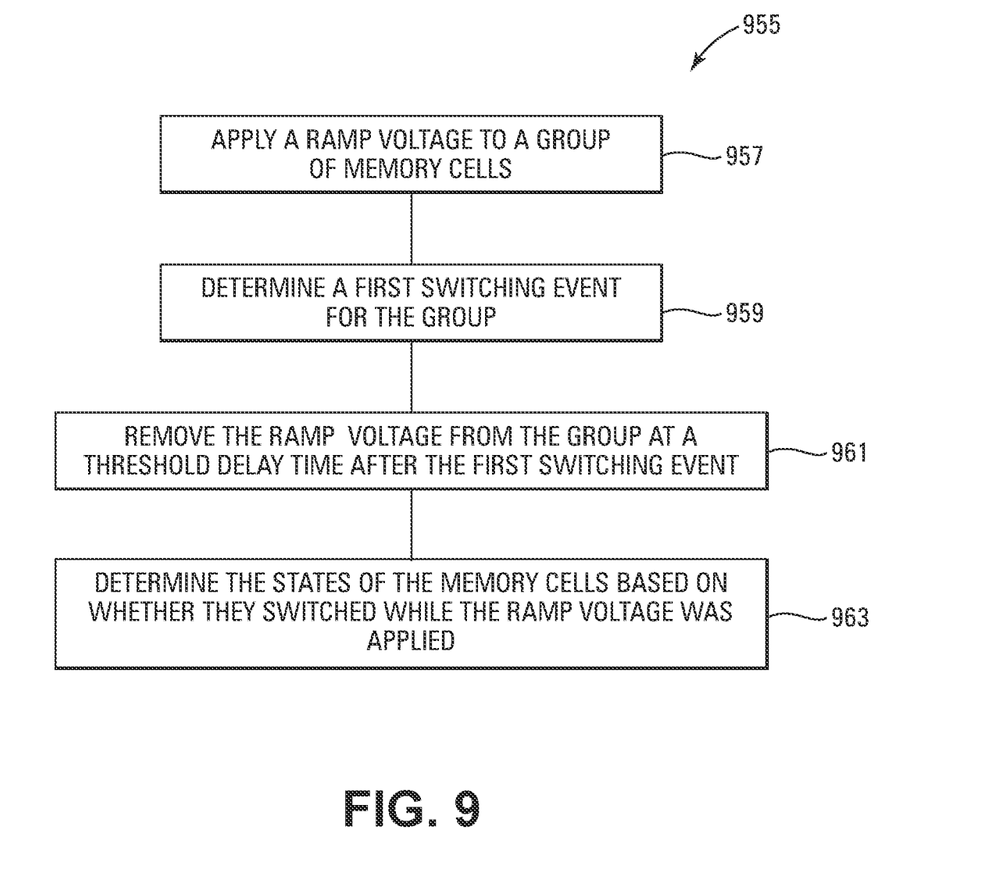
FIG. 9 illustrates a flowchart of a method, in accordance with a number of embodiments of the present disclosure.

FIG. 9 illustrates a flowchart of a method 955, such as a read method, that may be implemented by controller 108 and that may correspond to FIGS. 4A and 4B, in accordance with a number of embodiments of the present disclosure. A ramp voltage is applied to a group of memory cells in block 957. At block 959 a first switching event is determined for the group. The ramp voltage is removed at the threshold delay time after the first switching event at block 961. At block 963, the states of the memory cells are determined based on whether they switched while the ramp voltage was being applied. For example, memory cells that switch while the ramp voltage was applied, including the memory cell that switched first, are in state 1. Otherwise, the memory cells are in state 0. Although states 1 and 0 were used to respectively denote the low and high states of a memory cell, the disclosure is not so limited. For example, states 0 and 1 can be used to respectively denote the low and high states.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" something can refer to one or more of such things. For example, a number of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A method for sensing memory cells, the method comprising:
    sensing a first portion of a group of memory cells concurrently subjected to a timewise increasing ramp voltage as storing a first data value based on a determination, made without utilizing a reference voltage comparison, that the first portion of the group of memory cells experienced a switching event responsive to the ramp voltage within a particular amount of time after a first memory cell of the group of memory cells experienced the switching event during the ramp voltage; and
    sensing a second portion of the group of memory cells concurrently subjected to the timewise increasing ramp voltage as storing a second data value based on a determination, made without utilizing a reference voltage comparison, that the second portion of the group of memory cells did not experience the switching event responsive to the ramp voltage within the particular amount of time after the first memory cell of the group of memory cells experienced the switching event during the ramp voltage.

2. The method of claim 1, further comprising removing the timewise increasing ramp voltage upon an end of the particular amount of time.

3. The method of claim 1, further comprising:
    determining that the first portion of the group of memory cells that switches in response to the applied voltage ramp is in the first state; and
    determining that the second portion of the group of memory cells that does not switch while the voltage ramp is applied is in a second state.

4. The method of claim 1, further comprising:
    applying the timewise increasing ramp voltage to a signal line common to each of the group of memory cells while concurrently applying a same voltage to each of a plurality of signal lines respectively coupled to a corresponding memory cell of the group of memory cells such that the timewise increasing ramp voltage is applied across each of the group of memory cells concurrently.

5. The method of claim 4, further comprising:
    sensing the first portion of the group of memory cells experienced the switching event by sensing, by each of a plurality of sense amplifiers respectively coupled to a corresponding memory cell of the first portion of the group of memory cells, a change in current at each of the first portion of the group of memory cells responsive to the ramp voltage.

6. The method of claim 1, further comprising:
programming at least one memory cell of the group of memory cells to a particular data state to provide a reference switching event relative to which the timing of other switching events may be compared to identify their associated data states.

7. The method of claim 1, further comprising:
determining a data state of the second portion of the group of memory cells without reaching a switching voltage for the second portion of the group of memory cells during the ramp voltage.

8. An apparatus, comprising:
an array of memory cells; and
a controller coupled to the array and configured to sense an encoded data pattern stored in a group of memory cells of the array of memory cells by:
sensing a first portion of the group of memory cells, concurrently subjected to a timewise increasing ramp voltage, as storing a first data value based on a determination, made without utilizing a reference voltage comparison, that the first portion of the group of memory cells experienced a switching event responsive to the ramp voltage within a particular amount of time after a first memory cell of the group of memory cells experienced the switching event during the ramp voltage; and
sensing a second portion of the group of memory cells concurrently subjected to the timewise increasing ramp voltage as storing a second data value based on a determination, made without utilizing a reference voltage comparison, that the second portion of the group of memory cells did not experience the switching event responsive to the ramp voltage within the particular amount of time after the first memory cell of the group of memory cells experienced the switching event during the ramp voltage.

9. The apparatus of claim 8, further comprising:
a first signal line commonly coupled to each memory cell of the group of memory cells;
a plurality of second signal lines respectively coupled to a corresponding memory cell of the group of memory cells; and
a plurality of sense amplifiers respectively coupled to a corresponding memory cell of the group of memory cells via a corresponding second signal line of the plurality of second signal lines.

10. The apparatus of claim 9, wherein the controller is further configured to sense the encoded data pattern stored in the group of memory cells of the array of memory cells by:
applying the timewise increasing ramp voltage to the first signal line while concurrently applying a same voltage to each of the plurality of second signal lines such that the timewise increasing ramp voltage is applied across each of the group of memory cells concurrently.

11. The apparatus of claim 10, wherein the controller is further configured to sense the encoded data pattern stored in the group of memory cells of the array of memory cells by:
sensing the first portion of the group of memory cells experienced the switching event by sensing, by each sense amplifier respectively coupled to a corresponding memory cell of the first portion of the group of memory cells, a change in current responsive to the ramp voltage; and
sensing the second portion of the group of memory cells did not experience the switching event by failing to sense, by each sense amplifier respectively coupled to a corresponding memory cell of the second portion of the group of memory cells, a change in current responsive to the ramp voltage.

12. The apparatus of claim 8, wherein:
the group of memory cells are configured to store data according to an encoding function; and
each encoded data pattern data pattern corresponding to the encoding function comprises at least one data unit having the first data value.

13. The apparatus of claim 8, wherein the controller is further configured to sense the encoded data pattern stored in the group of memory cells of the array of memory cells by:
determining, prior to a duration of the timewise increasing voltage ramp at which the timewise increasing voltage ramp reaches a voltage capable of producing the switching event in the second portion of the group of memory cells; and
discontinuing the timewise increasing voltage ramp prior to the duration of the timewise increasing voltage ramp at which the timewise increasing voltage ramp reaches the voltage capable of producing the switching event in the second portion of the group of memory cells.

14. The apparatus of claim 8, the controller is further configured to sense the encoded data pattern stored in the group of memory cells of the array of memory cells by:
determining that the first portion of the group of memory cells experienced the switching event by sensing whether the first portion of the group of memory cells experienced a snapback event.

15. The apparatus of claim 8, wherein the group of memory cells comprises a plurality of sets of memory cells each comprising N memory cells, wherein "N" is at least 2, and wherein the encoding function is applied on per set basis such that the code patterns per set include only those code patterns having at least one of the first data value.

16. The apparatus of claim 15, wherein a particular memory cell in each set of the plurality of sets of memory cells is a set cell which will always switch first and wherein remaining memory cells of each set of the plurality of sets of memory cells are the only cells utilized for data storage.

17. An apparatus, comprising:
a memory comprising a group of memory cells; and
a controller configured to:
determine, without utilizing a reference voltage comparison, states of each memory cell of the group of memory cells based on whether the each memory cell undergoes a switching event while a timewise increasing ramp voltage is being applied concurrently across the group of memory cells for a particular time after a first memory cell of the group of memory cells undergoes a switching event.

18. The apparatus of claim 17, wherein the controller is configured to select the particular amount of time such that a magnitude of the voltage ramp after the particular amount of time is insufficient to cause the switching event to occur to those memory cells of the group storing a second data value.

19. The apparatus of claim 17, wherein the controller is configured to determine whether the each memory cell undergoes a switching event based only on whether the each memory cell undergoes a switch in conductivity state as reflected in an output voltage of a connected sense amplifier.

20. The apparatus of claim 17, wherein the controller is configured to remove the timewise increasing voltage ramp applied concurrently across the group of memory cells after the particular time after the first memory cell of the group of memory cells undergoes the switching event and before the timewise increasing voltage ramp reaches a threshold voltage sufficient to trigger a switching event in memory cells of the group of memory cells storing a data value different than a data value stored in the first memory cell.

* * * * *